United States Patent [19]
Inbasekaran et al.

[11] Patent Number: 5,777,070
[45] Date of Patent: Jul. 7, 1998

[54] PROCESS FOR PREPARING CONJUGATED POLYMERS

[75] Inventors: Michael Inbasekaran; Weishi Wu; Edmund P. Woo, all of Midland, Mich.

[73] Assignee: The Dow Chemical Company, Midland, Mich.

[21] Appl. No.: 956,797

[22] Filed: Oct. 23, 1997

[51] Int. Cl.$^6$ .................................................. C08G 79/08
[52] U.S. Cl. .......................... 528/394; 528/8; 528/397; 528/488; 252/301.16; 252/301.35
[58] Field of Search ........................ 528/8, 394, 488, 528/397; 252/301.16, 301.35

[56] References Cited

PUBLICATIONS

Burrows, P. E. et al., Appl. Phys. Lett., vol. 64, No. 20, pp. 2718–2720 (May 16, 1994).
Cho, H. N. et al., Adv. Mater., vol. 9, No. 4, pp. 326–328 (1997).
"Crosslinkable Branched Polyarylamines", filed in the United States of America on Aug. 13, 1996, Application Serial No. 08/696,280; Applicants: E. P. Woo et al.
"Crosslinkable or Chain Extendable Polyarylpolyamines and Films Thereof", filed in the United States of America on Feb. 23, 1996, Application Serial No. 08/606,180; Applicants: E. P. Woo et al.
Hamada, Y. et al., Chemistry Letters, pp. 905–906 (1993).
Hamada, Y. et al., Optoelectronics, vol. 7, No. 1, pp. 83–93 (Jun. 1992).
Ishikura, M. et al., Synthesis, pp. 936–938 (Nov. 1984).
Kido, J. et al., Chemistry Letters, pp. 47–48 (1996).
Kim, J. K. et al., Polymer Bulletin, vol. 38, pp. 169–176 (1997).
Li, X.–C. et al., J. Chem. Soc., Chem Commun., pp. 2211–2212 (1995).
March, J., Adv. Org. Chem., 3$^{rd}$ Ed., pp. 320–322 (1992).
Miller, R. D. et al., Polymer Preprints, vol. 38, No. 1, pp. 421–422 (Apr. 1997).
Miyaura, N. et al., Chem. Rev., vol. 95, pp. 2457–2483 (1995).
Miyaura, N. et al., Synthetic Communications, vol. 11, No. 7, pp. 513–519 (1981).
O'Brien, D. et al., Synthetic Metals vol. 76, pp. 105–108 (1996).
"Poly(arylamines) and Films Thereof", filed in the United States of America on Aug. 13, 1996, Application Serial No. 08/696,281; Applicants: W. Wu et al.
Sandman, D. J., Trends in Polymer Science, vol. 2, No. 2, pp. 44–55 (Feb. 1994).
Scherf, U. et al., Makromol. Chem., Rapid Commun., vol. 12, pp. 489–497 (1991).
Strukelj, M., Science, vol. 267, pp. 1969–1972 (Mar. 31, 1995).
Wallow, T. I. et al., J. Org. Chem., vol. 59, pp. 5034–5037 (1994).
Wallow, T. I. et al., Polymer Preprints, vol. 34, No. 1, pp. 1009–1010 (1993).

*Primary Examiner*—Duc Truong
*Attorney, Agent, or Firm*—Ann K. Galbraith

[57] ABSTRACT

A process for preparing conjugated polymers which comprises contacting (i) monomers having two reactive groups selected from boronic acid, $C_1$–$C_6$ boronic acid ester, $C_1$–$C_6$ borane, and combinations thereof, with aromatic dihalide-functional monomers or (ii) monomers having one reactive boronic acid, boronic acid ester, or borane group and one reactive halide-functional group, with each other; (wherein the monomers are selected so that the polymerization reaction product of such has conjugated unsaturated internal groups) in a reaction mixture which contains: (a) an organic solvent in which the polymer forms at least a 1 percent solution; (b) an aqueous solution of an inorganic base having a pKa in the range of from 9 to 13, said solution having a concentration of at least 0.1N; (c) a catalytic amount of a palladium complex; and (d) at least 0.01 mole percent of a phase transfer catalyst, based on the number of moles of boronic acid, boric acid ester, and borane groups in the reaction mixture; under reaction conditions sufficient to form the corresponding conjugated polymer.

23 Claims, No Drawings

PROCESS FOR PREPARING CONJUGATED POLYMERS

BACKGROUND OF THE INVENTION

This invention relates to processes for reacting diboronic acids, diboronic acid esters, and/or diboranes with aromatic dihalides to form conjugated polymers.

A conjugated polymer is one which possesses a delocalized pi-electron system along the backbone as described, for example, by D. J. Sandman in *Trends in Polymer Science*, Vol. 2, p. 44 (1994). One route to these polymers is based on the efficient Pd-catalyzed cross-coupling reaction (commonly referred to as the "Suzuki reaction") between an aromatic boronic acid derivative and an aromatic halide to yield the corresponding biphenyl, as first reported by Suzuki in *Synthetic Communications*, Vol. 11, No. 7, p. 513 (1981). The reaction requires a soluble Pd compound either in the form of Pd (II) salts or Pd (0) complexes. $Pd(OAc)_2$ with a tertiary phosphine ligand and $Pd(Ph_3P)_4$ in the range of 0.01–5 mole % based on the aromatic reactants are the commonly preferred Pd sources. The reaction also requires a base, aqueous alkaline carbonate or bicarbonate being the most preferred. Alkenyl and alkynyl derivatives may be used in place of the aromatic compounds (N. Miyaura and A. Suzuki, *Chemical Reviews*, Vol. 95, p. 2457 (1995)). Wallow and Novak, in an attempt to define the optimum conditions for effecting this reaction, (*Journal of Organic Chemistry*, Vol. 59, p. 5034 (1994)) found that aqueous carbonate and water-miscible acetone and tetrahydrofuran gave the best results while nonpolar solvents, such as toluene, slowed the reaction markedly. Attempts to accelerate the reaction in nonpolar solvents by use of phase transfer catalysts were met with "uniform failure".

The Suzuki coupling reaction has been applied to the preparation of conjugated aromatic polymers as depicted in Equation 1:

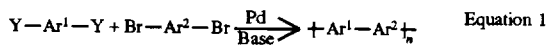

Equation 1 where $Ar^1$ and $Ar^2$ are aromatic radicals, Y is a boronic acid or boronate radical. Thus, Scherf and Mullen (*Makromoleculare Chemistry, Rapid Communications*, Vol. 12, p. 489 (1992)) reacted alkylated 1,4-phenylene diboronic acids with 2',5'-dibromo-4-alkyl-4'-(4-alkylbenzoyl) benzophenones in refluxing toluene/aqueous potassium carbonate solution with between 1–2 mole % of $Pd(Ph_3P)_4$ for 1 day and obtained relatively low molecular weight polymers, $M_w$ ranging from 600 to 15,100 gram/mole (relative to polystyrene standards). More recently Tanigaki and Kaeriyama (*Polymer*, Vol. 38, p. 1221 (1997)) reported on a series of aromatic polymers prepared by reacting 2,5-di-n-heptylbenzene-1,4-diboronate with a variety of aromatic dibromides with the same Pd catalyst in refluxing toluene-aqueous sodium carbonate for 72 hours. The molecular weights of the polymers obtained fluctuated widely, $M_w$ ranging from 4000 to 45,000 gram/mole. Since the molecular weight of a polymer largely determines its properties, e.g., thermal transitions, mechanical integrity, film forming ability, etc., clearly there is a need for an improved process that will consistently yield polymers of high molecular weight, and preferably one that requires a shorter reaction time.

SUMMARY OF THE INVENTION

In one aspect, this invention is a process for preparing a conjugated polymer which comprises contacting (i) monomers having two reactive groups selected from boronic acid, $C_1$–$C_6$ boronic acid ester, $C_1$–$C_6$ borane, and combinations thereof, with aromatic dihalide-functional monomers or (ii) monomers having one reactive boronic acid, boronic acid ester, or borane group and one reactive halide-functional group, with each other;

wherein the monomers are selected so that the polymerization reaction products of such have conjugated unsaturated internal groups;

in a reaction mixture which contains:
(a) an organic solvent in which the polymer forms at least a 1 percent solution;
(b) an aqueous solution of an inorganic base having a pKa in the range of from 9 to 13, said solution having a concentration of at least 0.1N;
(c) a catalytic amount of a palladium complex; and
(d) at least 0.01 mole percent of a phase transfer catalyst, based on the number of moles of boronic acid, boric acid ester, and borane groups in the reaction mixture;

under reaction conditions sufficient to form the corresponding conjugated polymer.

It has been discovered that the process of the invention unexpectedly produces relatively high molecular weight polymers having a low polydispersity index in a relatively short amount of time. It is believed, without intending to be bound thereby, that the phase-transfer catalyst facilitates the transfer of the boronate anion form the aqueous solution into the organic layer, wherein the reaction between the boronate and the halide-palladium complex present therein proceeds rapidly, leading to polymer formation. These and other advantages of the invention will be apparent from the description which follows.

DETAILED DESCRIPTION OF THE INVENTION

The process of the invention may be used to polymerize both AA-BB and AB type monomers. Polymerizations of the AA-BB type (monomers (i)) may be represented by Equation 2.

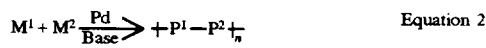

Equation 2

Polymerizations of the AB type (monomers (ii)) may be represented by Equation 3:

Equation 3 wherein $M^1$, $M^2$, and $M^3$ are molecules having unsaturated internal groups, in addition to two reactive groups attached to $sp^2$ or sp carbon atoms (hereafter, collectively, "monomers"). $M^1$ monomers have reactive groups selected from boronic acid $|B(OH)_2|$, boronic ester $|B(OR)_2$ where R is $C_1$–$C_6$ hydrocarbyl or the two R groups connected as in —$CH_2$—$CH_2$— and |—$CH_2$—$CH_2$—$CH_2$—| or borane $|BR_2|$ group, wherein $R_2$ is $C_1$–$C_{20}$ hydrocarbyl (hereafter, collectively, "boron derivatives"). The term "halide-functional" as used herein refers to monomers having reactive groups selected from iodide, bromide, and triflate ($CF_3SO_3$—), and combinations thereof. In the above Equation 2, $M^2$ monomers are dihalide-functional and have two of such groups. $M^3$ monomers in Equation 3 have one halide-functional group and one boron-derivative group. $P^1$, $P^2$, and $P^3$ refer to the residues of $M^1$, $M^2$, and $M^3$, respectively, remaining after reaction of their reactive groups in the polymerization reaction. The boron-derivative groups in the above monomers are preferably boronic acid or boronate groups, and are most preferably boronate groups. The halide-functional groups in the above monomers are preferably bromide or iodide, and most preferably bromide.

Preferably, about 50 mole percent of the reactive groups present in the polymerization reaction mixture are boron derivative groups; and the remaining reactive groups are selected from the halide-functional groups. "Conjugated unsaturated groups" refers to internal groups having double bonds, triple bonds and/or aromatic rings in conjugation, and "conjugated polymers" refer to polymers containing such groups. The incorporation of such groups into the polymer may be used to optimize the light absorption, ionization potential, and/or electronic properties of the polymer for a particular application.

Preferably, the monomers contain internal groups selected from ethylene, acetylene, $C_6$–$C_{20}$ mononuclear/polynuclear aromatic hydrocarbons, $C_2$–$C_{10}$ mononuclear/polynuclear heterocycles, and tertiary arylamines. Examples of mononuclear/polynuclear aromatic hydrocarbon internal groups include phenylene, naphthylene, fluorene, acenaphthene, phenanthrene, anthracene, fluoranthene, pyrene, perylene, rubrene, and chrysene.

Examples of mononuclear/polynuclear heterocyclic internal groups include 5-member heterocycles such as furan, thiophene, pyrrole, oxazole, isooxazole, thiazole, isothiazole, imidazole, oxadiazoles, thiadiazole, and pyrazoles; 6-member heterocycles such as pyridine, pyridazine, pyrimidine, pyrazine, triazines, and tetrazenes; benzo-fused ring systems such as benzoxazole, benzothiazole, benzimidazole, quinoline, isoquinoline, cinnoline, quinazoline, quinoxaline, phthalazine, benzothiadiazole, and benzotriazines; and polynuclear condensed ring systems such as phenazine, phenanthridine, acridine, carbazole, and diphenylene oxide. Examples of tertiary arylamine groups include triphenylamine, N,N'-diphenylbenzidine, N,N'-diphenyl-1,4-phenylenediamine, and diphenylnaphthylamine. In general, olefinic, arylamino, aromatic and heterocyclic aromatic groups containing up to 30 carbons are useful for the present purpose. They may be substituted optionally with one or more substituents. Examples of substituents include $C_1$–$C_{20}$ hydrocarbyl radicals, $C_1$–$C_{20}$ (thio)alkoxy radicals, $C_1$–$C_{20}$ (thio)aryloxy radicals, cyano, fluoro, chloro, $C_1$–$C_{20}$ alkoxycarbonyl, $C_1$–$C_{20}$ aryoxylcarbonyl, poly(alkyleneoxy) and alkyl(aryl)sulfonyl radicals. Such substituents may be selected to improve the solubility or processing characteristics of the polymer. In such cases, the substituent is preferably selected from alkyl, alkoxy, polyalkyleneoxy, and cyano, and is most preferably alkoxy. The process of the invention may also utilize more than two types of the above-described monomers. The process is also applicable to AB type polymerizations wherein the monomers each have one boron derivative group and one halogen group ($M^3$ monomers). If desired, a monofunctional aryl halide or aryl boronate may be used as a chain-terminator in such reactions, which will result in the formation of a terminal aryl group. Preferably, the monomers contain internal fluorene groups.

Examples of $M^1$ monomers include 9,9-dialkyl-2,7-fluorenediboronates and 9,9-diaryl-2,7-fluorenediboronates. Examples of $M^2$ monomers include 9,9-disubstituted-di-2, 7-bromofluorenes and 4,7-dibromo-2,1,3-benzothiadiazole. Examples of $M^3$ monomers include 4-bromobenzeneboronate and 9,9-disubstituted-2-bromo-7-fluoreneboronates.

If $M^1$ and $M^2$ monomers are used, the molar ratio of monomers having two boron derivative groups to monomers having two halide-functional groups is preferably at least 0.98:1.00, more preferably at least 1:1, most preferably at least 1.02:1.00; but is preferably no greater than 1.1:1.0, more preferably no greater than 1.06:1.00.

Organic solvents suitable for use in the process of the invention include those capable of dissolving the monomers to a solution concentration of at least 1 percent, more preferably at least 2 percent. Preferably, the solvent is a $C_6$–$C_{20}$ aromatic group-containing compound, and more preferably is benzene, toluene, xylene, ethylbenzene, mesitylene, anisole, or a fluorinated analog thereof, with toluene being the most preferred. The volume of solvent in the reaction should be such that efficient mixing can be maintained at reflux as the reaction mixture becomes increasingly viscous due to build-up of polymer molecular weight. This is generally in the range of 5–20 mL of solvent to every gram of polymer, preferably about 10 mL of toluene for every gram of polymer.

Examples of aqueous inorganic bases useful in the process of the invention include alkali metal carbonates and bicarbonates. Preferably, the aqueous base is a solution of an aqueous alkali metal carbonate, such as 1–2M sodium or potassium carbonate. The exact ratio of base to monomer is not significant as long as the molar amount of base exceeds the molar amount of monomer. Preferably, the base is employed in an amount in the range of 1 to 3 moles of base to each mole of halide-functional monomer.

Palladium may be added as Pd (II) salts or as Pd (0) complexes. Pd acetate is the preferred Pd (II) salt while $Pd(Ph_3P)_4$ is the preferred Pd (0) complex. When a Pd (II) salt is used, it is advantageous to add to the reaction mixture 2–4 molar equivalents of triphenylphosphine ($Ph_3P$) per mole of Pd salt. Alternatively, a Pd (II)-$Ph_3P$ complex, e.g. $PdCl_2(Ph_3P)_2$ may be used. The amount of Pd to monomer is preferably in the range of $1\times10^{-6}$ mole to $1\times10^{-2}$ mole of Pd for each mole of monomer, more preferably $1\times10^{-5}$ mole to $1\times10^{-2}$ mole of Pd for each mole of monomer, the most preferred range is of $1\times10^{-4}$ mole to $1\times10^{-3}$ mole of Pd for each mole of monomer.

The term "phase transfer catalyst" as used herein means quaternary ammonium and phosphonium salts, crown ethers, cryptands, as well as "triphase" catalysts, as described in March, *Advanced Organic Chemistry*, 3rd Ed., pp. 320–322 (1992). Preferably, the phase transfer catalyst is a tetraalkylammonium halide, tetraalkylammonium hydrogen sulfate, or a tetraalkylammonium hydroxide. Preferably, the four alkyl groups of such catalysts have a combined total of 16–120 carbon atoms. Examples of most preferred phase transfer catalysts are tetra-n-butylammonium halide, benzyltriethylammonium halide, and tricaprylylmethylammonium chloride (available as Aliquat® 336 from Aldrich Chemical). Preferably, the molar ratio of phase transfer catalyst to monomer is at least about 0.01 mole of catalyst to each mole of monomer, more preferably at least 0.05 mole; but preferably no greater than to 0.5, more preferably no greater than 0.1.

The preferred upper limit of reaction temperature is the boiling point of the immiscible liquid mixture consisting of a solution of monomers in the organic solvent and aqueous base. In general, it is preferred to limit the reaction temperature to below 150° C., more preferably below 130° C. and most preferably below 120° C.

The reaction proceeds rapidly and in most cases evidence of molecular weight build-up is seen after 1–2 hours. A preferred reaction time is between 10–50 hours, a most preferred reaction time is less than 24 hours. The polymers prepared by the process of the invention preferably have degree of polymerization (per monomer) of at least 20, more preferably at least 50, most preferably at least 100; and a polydispersity of no greater than 6, more preferably no greater than 5, and most preferably no greater than 4.

Preferably, the polymers prepared by the process of the invention contain units of the formulas:

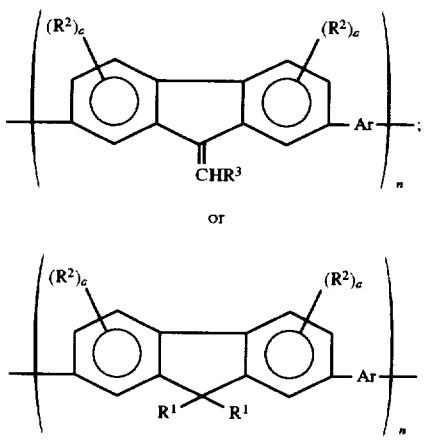

wherein n is a number of at least 20; Ar is a conjugated unsaturated group; and $R^1$, $R^2$, and $R^3$ are as defined below. To prepare such polymers, a halide corresponding to Formula (IV), Formula (VI), or a mixture thereof, may be reacted with an equimolar amount of diboronic acid or diboronate corresponding to Formulas (III), (V), or a mixture thereof under the catalytic action of Pd:

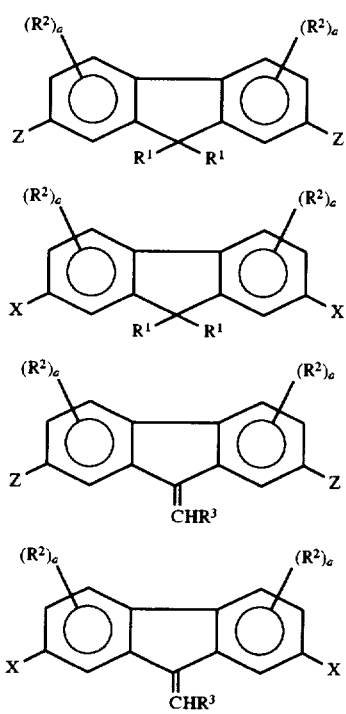

wherein $R^1$ is independently in each occurrence $C_1-C_{20}$ hydrocarbyl or $C_1-C_{20}$ hydrocarbyl containing one or more S, N, O, P or Si atoms, $C_4-C_{16}$ hydrocarbyl carbonyloxy, $C_4-C_{16}$ aryl(trialkylsiloxy) or both, $R^1$ may form with the 9-carbon on the fluorene ring a $C_5-C_{20}$ ring structure or a $C_4-C_{20}$ ring structure containing one or more heteroatoms of S, N or O;

$R^2$ is independently in each occurrence $C_1-C_{20}$ hydrocarbyl, $C_1-C_{20}$ hydrocarbyloxy, $C_1-C_{20}$ thioether, $C_1-C_{20}$ hydrocarbylcarbonyloxy or cyano;

$R^3$ is independently in each occurrence $C_1-C_{20}$ hydrocarbyl or $C_1-C_{20}$ hydrocarbyl substituted with di($C_1-C_{20}$ alkyl)amino, $C_1-C_{20}$ hydrocarbyloxy or $C_1-C_{20}$ hydrocarbyl or tri($C_1-C_{10}$ alkyl)siloxy;

a is independently in each occurrence 0 or 1;

X is independently in each occurrence a halide-functional group; and

Z is independently in each occurrence a boron derivative group.

Polymer Applications

Polymers prepared by the process of the invention may be used to prepare films thereof. Such films may be used in polymeric light-emitting diodes. Preferably, such films are used as emitting layers or charge carrier transport layers. These oligomers and polymers may also be used as protective coatings for electronic devices and as fluorescent coatings. The thickness of the coating or film is dependent upon the ultimate use. Generally, such thickness can be from 0.01 to 200 microns. In that embodiment wherein the coating is used as a fluorescent coating, the coating or film thickness is from 50 to 200 microns. In that embodiment where the coatings are used as electronic protective layers, the thickness of the coating can be from 5 to 20 microns. In that embodiment where the coatings are used in a polymeric light-emitting diode, the thickness of the layer formed is 0.02 to 2 microns. The oligomers or polymers of the invention form good pinhole- and defect-free films. Such films can be prepared by means well known in the art including spin-coating, spray-coating, dip-coating and roller-coating. Such coatings are prepared by a process comprising applying a composition to a substrate and exposing the applied composition to conditions such that a film is formed. The conditions which form a film depend upon the application technique and whether the polymers contain reactive end groups. In a preferred embodiment, the composition applied to the substrate comprises the 2,7-diaryl-9-substituted fluorene oligomers or polymers dissolved in a common organic solvent. Preferably, the solution contains from 0.1 to 10 weight percent of the oligomers or polymers. For thin coatings, it is preferred that the composition contains from 0.5 to 5.0 percent by weight of the oligomers or polymers. This composition is then applied to the appropriate substrate by the desired method and the solvent is allowed to evaporate. Residual solvent may be removed by vacuum and/or by heat. If the solvent is low boiling, then low solution concentrations, for example, 0.1 to 2 percent, are desired. If the solvent is high boiling, then high concentrations, for example, 3 to 10 percent, are desired. After removal of the solvent, the coating is then exposed to the necessary conditions to cure the film, if needed, to prepare a film having high solvent and heat resistance. The films are preferably substantially uniform in thickness and substantially free of pinholes. Preferably, the films are dried when exposed to temperatures of 50° C. or greater, more preferably 100° C. or greater and most preferably 150° C. or greater. Preferably, the films cure at a temperature of 300° C. or less.

Yet another aspect of the invention relates to organic electroluminescent (EL) devices comprising a film of the polymers prepared by the process of this invention. An organic EL device typically consists of an organic film sandwiched between an anode and a cathode such that when a positive bias is applied to the device, holes are injected into the organic film from the anode, and electrons are injected into the organic film from the cathode. The combination of a hole and an electron may give rise to an exciton which may undergo radiative decay to the ground state by liberating a photon. In practice, the anode is commonly a mixed oxide of tin and indium (ITO) for its conductivity and transparency. The ITO is deposited on a transparent substrate such as glass or plastic so that the light emitted by the organic film may be observed. The organic film may be the composite of several individual layers each designed for a distinct function. Since holes are injected from the anode, the layer next to the anode needs to have the functionality of transporting holes. Similarly, the layer next to the cathode needs to have the functionality of transporting electrons. In many instances, the hole- (electron) transporting layer also acts as the emitting layer. In some instances, one layer can perform the combined functions of hole and electron transport and light emission. The individual layers of the organic film may be all polymeric in nature or combinations of films of polymers and films of small molecules deposited by thermal evaporation. It is preferred that the total thickness of the organic film be less than 1000 nanometers (nm). It is more preferred that the total thickness be less than 500 nm. It is most preferred that the total thickness be less than 300 nm. One embodiment of the instant invention is EL devices whose organic film comprises at least one of the polymeric compositions of this invention.

The ITO-glass which serves as the substrate and the anode may be used for coating after the usual cleaning with detergent, organic solvents and UV-ozone treatment. It may also be first coated with a thin layer of a conducting substance to facilitate hole injection. Such substances include copper phthalocyanine, polyaniline and poly(3,4-ethylenedioxy-thiophene) (PEDT); the last two in their conductive forms by doping with a strong organic acid, e.g., poly(styrenesulfonic acid). It is preferred that the thickness of this layer be 200 nm or less; it is more preferred that the thickness be 100 nm or less.

In the cases where a hole-transporting layer is used, the polymeric arylamines described in U.S. patent application Ser. No. 08/606,180, filed on Feb. 23, 1996, now abandoned; U.S. patent application Ser. No. 08/696,280, filed on Aug. 13, 1996, now pending, and U.S. patent application Ser. No. 08/696,281, filed on Aug. 13, 1996, now U.S. Pat. No. 5,728,801, may be used, all of which are hereby incorporated by reference. Other known hole-conducting polymers, such as polyvinylcarbazole, may also be used. The resistance of this layer to erosion by the solution of the copolymer film which is to be applied next is obviously critical to the successful fabrication of multi-layer devices. As the copolymers of this invention are applied as xylene or toluene solutions, the hole-transporting layer needs to be insoluble in these solvents. The thickness of this layer may be 500 nm or less, preferably 200 nm or less, most preferably 100 nm or less.

In the case where an electron-transporting layer is used, it may be applied either by thermal evaporation of low molecular weight materials or by solution coating of a polymer with a solvent that would not cause significant damage to the underlying film.

Examples of low molecular weight materials include the metal complexes of 8-hydroxyquinoline (as described by Burrows et al. in *Applied Physics Letters*, Vol. 64, pp. 2718–2720 (1994)), metallic complexes of 10-hydroxybenzo(h)quinoline (as described by Hamada et al. in *Chemistry Letters*, pp. 906–906 (1993)), 1,3,4-oxadiazoles (as described by Hamada et al. in *Optoelectronics—Devices and Technologies*, Vol. 7, pp. 83–93 (1992)), 1,3,4-triazoles (as described by Kido et al. in *Chemistry Letters*, pp. 47–48 (1996)), and dicarboximides of perylene (as described by Yoshida et al. in *Applied Physics Letters*, Vol. 69, pp. 734–736 (1996)).

Polymeric electron-transporting materials are exemplified by 1,3,4-oxadiazole-containing polymers (as described by Li et al. in *Journal of Chemical Society*, pp. 2211–2212 (1995), and by Yang and Pei in *Journal of Applied Physics*, Vol. 77, pp. 4807–4809 (1995)), 1,3,4-triazole-containing polymers (as described by Strukelj et al. in *Science*, Vol. 267, pp. 1969–1972 (1995)), quinoxaline-containing polymers (as described by Yamamoto et al. in *Japan Journal of Applied Physics*, Vol. 33, pp. L250–L253 (1994), O'Brien et al. in *Synthetic Metals*, Vol. 76, pp. 105–108 (1996)), and cyano-PPV (as described by Weaver et al. in *Thin Solid Films*, Vol. 273, pp. 39–47 (1996)). The thickness of this layer may be 500 nm or less, preferably 300 nm or less, most preferably 150 nm or less.

The metallic cathode may be deposited either by thermal evaporation or by sputtering. The thickness of the cathode may be from 100 nm to 10,000 nm. The preferred metals are calcium, magnesium, indium, ytterbium, and aluminum. Alloys of these metals may also be used. Alloys of aluminum containing 1 to 5 percent of lithium and alloys of magnesium containing at least 80 percent of magnesium are preferred.

The EL devices of this invention may emit light when subjected to an applied voltage of 50 volt or less with luminance efficiency as high as 6 Cd/A.

In a preferred embodiment, the EL device comprises at least one hole-transporting polymer film and a light-emitting polymer film comprised of the polymer of the invention, arranged between an anode material and a cathode material such that under an applied voltage, holes are injected from the anode material into the hole-transporting polymer film and electrons are injected from the cathode material into the light-emitting polymer films when the device is forward biased, resulting in light emission from the light-emitting layer. In another preferred embodiment, layers of hole-transporting polymers are arranged so that the layer closest to the anode has the lower oxidation potential, with the adjacent layers having progressively higher oxidation potentials. By these methods, EL devices having relatively high light output per unit voltage may be prepared.

The term "hole-transporting polymer film" as used herein refers to a layer of a film of a polymer which when disposed between two electrodes to which a field is applied and holes are injected from the anode, permits adequate transport of holes into the emitting polymer. Hole-transporting polymers typically are comprised of triarylamine groups. The term "light-emitting polymer film" as used herein refers to a layer of a film of a polymer whose excited states can relax to the ground state by emitting photons, preferably corresponding to wavelengths in the visible range. The term "anode material" as used herein refers to a semi-transparent, or transparent, conducting film with a work function between 4.5 electron volts (eV) and 5.5 eV. Examples are oxides and mixed oxides of indium and tin, and gold. The term "cathode material" as used herein refers to a conducting film with a work function between 2.5 eV and 4.5 eV. Examples are lithium, calcium, magnesium, indium, silver, aluminum, or blends and alloys of the above.

Illustrative Embodiments

The following examples are given to illustrate the invention and should not be interpreted as limiting it in any way. Unless stated otherwise, all parts and percentages are given by weight.

All inherent viscosity measurements given below were conducted at 25° C. in 0.5 g/dL THF solutions. The formulas of the monomers used are given below.

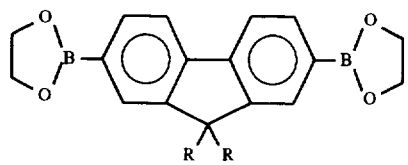

(1)

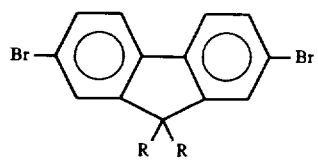

(2)

(3)

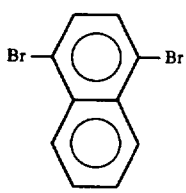

(4)

(5)

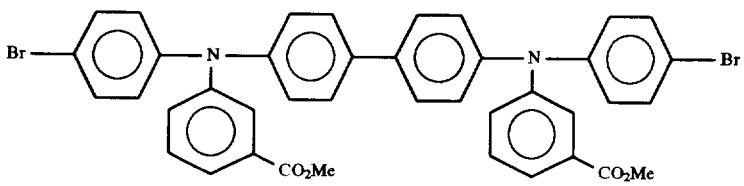

(6)

EXAMPLE 1

Preparation of a homopolymer of 9,9-di-n-octylfluorene

To a mixture of 9,9-di-n-octylfluorene-2,7-di (ethyleneboronate) (monomer (1)), R=n-octyl, 15.8 g, 29.49 mmol), 2,7-dibromo-9,9-di-n-octylfluorene (16.18 g, 29.49 mmol, (monomer (2)), R=n-octyl) in toluene (130 mL) under nitrogen is added Aliquat® 336 (1.5 g, 3.7 mmol), tetrakis(triphenylphosphine)palladium (0.18 g, 0.15 mmol), and 2M aqueous sodium carbonate (50 mL, 100 mmol). The mixture is stirred vigorously and heated at gentle reflux for 2 hours when a viscous reaction mixture is observed. An additional 50 mL of toluene is added and the reaction continued for another 15 hours. Sixty mL of toluene is then added to the very viscous reaction mixture and the heating and stirring are continued for 9 more hours. At the end of this period, the polymer is capped by adding 2 g of phenyl ethyleneboronate followed by heating for 15 hours, and one gram of bromobenzene followed by heating for 5 hours. The reaction mixture is cooled to about 60° C. and is added slowly to a stirred solution of 3 L of methanol and 300 mL of deionized water. The fibrous polymer is collected by filtration and is washed successively with methanol (500 mL), deionized water (200mL), and methanol (800 mL), and then dried in vacuum at 60° C. for 10 hours. The polymer weighed 23 g (100% yield). The inherent viscosity of the polymer is 1.50 dL/g. Molecular weight measurement by gel permeation chromatography shows a $M_w$ of 148,00 g/mole, $M_n$ of 47,980 g/mole relative to polystyrene standards. The spectral characteristics of the polymer are consistent with the structure:

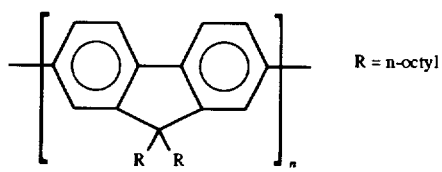

R = n-octyl

COMPARATIVE EXAMPLE 1

Preparation of a homopolymer of 9,9-di-n-octylfluorene without phase transfer catalyst (not an example of the invention)

The experiment of Example 1 is repeated at one-third the scale but without Aliquat® 336. The polymer, isolated after 60 hours of reflux has an inherent viscosity of 0.22 dL/g. Molecular weight measurement by gel permeation chromatography shows a $M_w$ of ~13,000 g/mole, $M_n$ of ~9,000 g/mole relative to polystyrene standards.

EXAMPLE 2

Preparation of a copolymer of 9,9-di-n-octylfluorene and 2,1,3-benzothiadiazole To a mixture of 9,9-di-n-octylfluorene-2,7-di (ethyleneboronate) (monomer (1)), R=n-octyl, 5.77 g, 10.87 mmol), 4,7-dibromo-2,1,3-benzothiadiazole (3.20 g, 10.87 mmol) (monomer (3)) in toluene (50 mL) under nitrogen is added Aliquat® 336 (1.1 g, 2.7 mmol), tetrakis (triphenylphosphine)palladium (0.056 g, 0.045 mmol), and 2M aqueous sodium carbonate (17 mL, 34 mmol). The mixture is stirred vigorously and heated at reflux for 16 hours. After end-capping with phenylboronate and then bromobenzene, the copolymer is isolated as bright yellow fibrous granules (5.7 g, 100% yield). The polymer has an inherent viscosity of 0.94 dL/g. The spectral characteristics of the polymer is consistent with the structure:

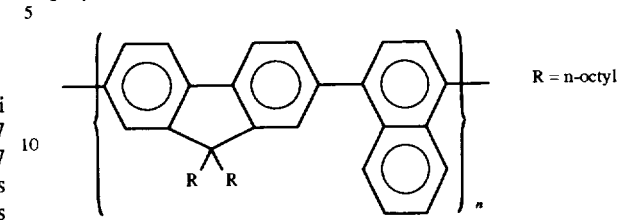

COMPARATIVE EXAMPLE 2

Preparation of a copolymer of 9,9-di-n-octylfluorene and 2,1,3-benzothiadiazole without phase transfer catalyst (not an example of the invention)

The experiment of Example 2 is repeated without Aliquat® 336. The product has an inherent viscosity of 0.14 dL/g.

EXAMPLE 3

Preparation of a copolymer of 9,9-di-n-octylfluorene and naphthalene

To a mixture of 9,9-di-n-octylfluorene-2,7-di (ethyleneboronate) (monomer (1)), R=n-octyl) (3.20 g, 6.03 mmol), 1,4-dibromonaphthalene (monomer (4), 1.725 g, 6.03 mmol) in toluene (40 mL) under nitrogen is added tetrakis(triphenylphosphine)-palladium (0.12 g, 0.1 mmol), and 2M aqueous sodium carbonate (12 mL, 24 mmol). The mixture is stirred vigorously and heated at reflux for 16 hours. An aliquot (0.05 mL) is removed and added to 10 mL of methanol. No fibrous polymeric precipitate is observed. To the reaction is then added 1.0 g of Aliquat® 336 and the reaction is stirred and heated for another hour. An aliquot is removed and when it is added to methanol as before, an off-white fibrous polymer precipitates. After an additional 15 hours, the polymer is isolated by precipitation in methanol (3.1 g, 100% yield). The polymer has an inherent viscosity of 0.39 dL/g. The spectral characteristics of the polymer is consistent with the structure:

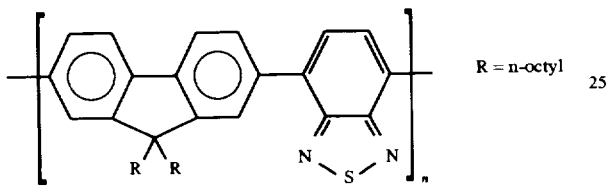

EXAMPLE 4

Preparation of a copolymer of 9,9-di-n-octylfluorene and bithiophene

To a mixture of 9,9-di-n-octylfluorene-2,7-di (ethyleneboronate) (monomer (1)), R=n-octyl, 6.40 g, 12.0 mmol), 5,5'-dibromo-2,2'-bithiophene (monomer (5)), (4.00 g, 12.0 mmol) in toluene (80 mL) under nitrogen is added tetrakis(triphenylphosphine)-palladium (0.18 g, 0.156 mmol), Aliquat® 336 (1.0 g), and 2M aqueous sodium carbonate (24 mL, 48 mmol). The mixture is stirred vigorously and heated at reflux for 24 hours. The highly viscous reaction mixture is poured into acetone (500 mL), precipitating a highly fibrous yellow polymer. The polymer is collected by filtration and washed with more acetone and dried in vacuum at 60° C. overnight. The polymer has an inherent viscosity of 1.84 dL/g. Its spectral characteristics are consistent with the structure:

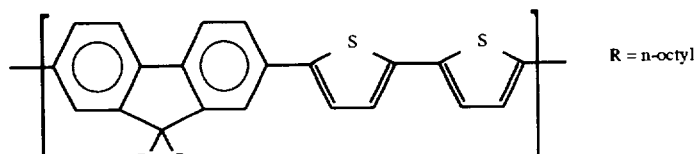

EXAMPLE 5

Preparation of a fluorene-benzidine copolymer

To a mixture of 9,9-di-n-octylfluorene-2,7-di (ethyleneboronate) (monomer (1)), R=n-octyl, 16.15 g, 30.9 mmol), N,N'-di(4-bromophenyl)-N,N'-di(3-carbomethoxyphenyl)benzidine (monomer (6)), (23.70g, 30.0 mmol) in toluene (225 mL) under nitrogen is added tetrakis (triphenylphosphine)palladium (0.035 g, 0.03 mmol), Aliquat® 336 (2.6 g), and 2M aqueous sodium carbonate (60 mL, 120 mmol). The mixture is stirred vigorously and heated at reflux for 24 hours. The usual isolation procedure gives a highly fibrous polymer with an inherent viscosity of 1.40 dL/g. Its spectral characteristics are consistent with the structure:

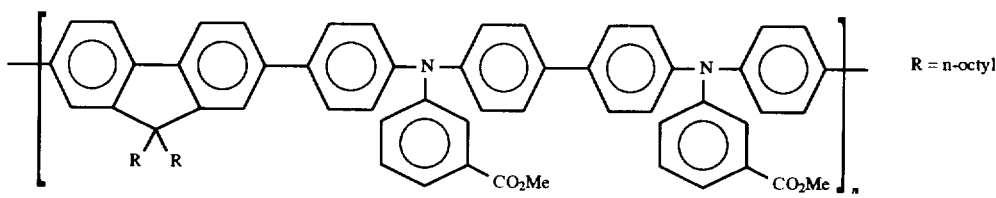

R = n-octyl

EXAMPLE 6

Preparation of a high molecular weight homopolymer of 9,9-dioctylfluorene

To a stirred mixture of 9,9-dioctyl 2,7-fluorenediboronate (27.42 g, 51.2 mmol), 2,7-dibromo-9,9-dioctylfluorene (27.43 g, 50 mmol) in toluene (450 mL) under nitrogen are added sequentially the phase transfer catalyst, Aliquat® 336 (1.4 g, 3.4 mmol), tetrakis(triphenylphosphine)palladium (38 mg, 0.032 mmol), and 2M aqueous sodium carbonate (80 mL, 160 mmol). The mixture is stirred and heated under gentle reflux for 20 hours when a viscous reaction mixture is observed. One gram of bromobenzene is added and stirring and heating continued for 5 hours. The reaction mixture is cooled to about 50° C., added slowly to a vigorously stirred mixture of 3.5 L of methanol and 200 mL of 1N aqueous HCl. The polymer fibers are collected by filtration, washed successively with methanol (1 L), deionized water (500 mL), and methanol (1 L), and dried in a vacuum oven at 60° C. for 16 hours. The polymer weighed 39 g (100% yield). The inherent viscosity of the polymer is found to be 1.65 dL/g (THF, 25° C., 0.5 g/dL). The polymer is purified further by passing a toluene solution of the polymer through a column of silica gel and re-precipitation from 4 L of methanol. The purified polymer weighs 37 g (95% yield).

EXAMPLE 7

Preparation of a copolymer of 9,9-di-n-octylfluorene and 9,9-di-(4-methoxyphenyl)fluorene To a mixture of 9,9-di-n-octylfluorene-2,7-di (ethyleneborate (monomer (1)), R=n-octyl, 3.26 g, 6.15 mmol), 2,7-dibromo-9,9-di(4-methoxyphenyl)fluorene (monomer (2)), R=4-methoxyphenyl, 3.22 g, 6.00 mmol) in toluene (60 mL) is added Aliquat® 336 (0.8 g), tetrakis (triphenylphosphine)palladium (13.8 mg, 0.012 mmol, 0.2 mol %) and 2M aqueous sodium carbonate (14 mL, 28 mmol). The mixture is stirred vigorously and heated at gentle reflux for 22 hours when a viscous reaction mixture is observed. At the end of this period, the polymer is capped by adding 1 g of bromobenzene followed by heating for 5 hours. The reaction mixture is cooled to about 60° C. and is added slowly to a stirred solution of 2 L of methanol and 200 mL of deionized water. The fibrous polymer is collected by filtration and is washed successively with methanol (200 mL), deionized water (100 mL), and methanol (200 mL), and then dried in vacuum at 60° C. for 10 hours. The polymer weighed 4.1 g (99% yield). The inherent viscosity of the polymer is 1.2 dL/g. The spectral characteristics of the polymer are consistent with the structure:

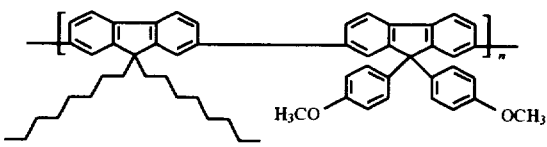

What is claimed is:

1. A process for preparing a conjugated polymer which comprises contacting (i) monomers having two reactive groups selected from boronic acid, $C_1-C_6$ boronic acid ester, $C_1-C_6$ borane, and combinations thereof, with aromatic dihalide-functional monomers or (ii) monomers having one reactive boronic acid, boronic acid ester, or borane group and one reactive halide-functional group, with each other;

wherein the monomers are selected so that the polymerization reaction products of such have conjugated unsaturated internal groups;

in a reaction mixture which contains:
  (a) an organic solvent in which the polymer forms at least a 1 percent solution;
  (b) an aqueous solution of an inorganic base having a pKa in the range of from 9 to 13, said solution having a concentration of at least 0.1N;
  (c) a catalytic amount of a palladium complex; and
  (d) at least 0.01 mole percent of a phase transfer catalyst, based on the number of moles of boronic acid, boric acid ester, and borane groups in the reaction mixture;

under reaction conditions sufficient to form the corresponding conjugated polymer.

2. The process of claim 1 wherein the molar ratio of monomers (i) having two groups selected from boronic acid, $C_1-C_6$ boronic acid ester, $C_1-C_6$ borane, and combinations thereof, to aromatic dihalide-functional monomers is at least 1.02:1.00.

3. The process of claim 1 wherein the organic solvent is a $C_6-C_{20}$ aromatic group-containing compound.

4. The process of claim 1 wherein the organic solvent is benzene, toluene, xylene, ethylbenzene, mesitylene, or anisole.

5. The process of claim 1 wherein the organic solvent is toluene.

6. The process of claim 1 wherein the inorganic base is an alkali metal carbonate, alkali metal bicarbonate, or mixture thereof.

7. The process of claim 4 wherein the inorganic base is an alkali metal carbonate, alkali metal bicarbonate, or mixture thereof.

8. The process of claim 1 wherein the inorganic base is sodium carbonate or potassium carbonate.

9. The process of claim 4 wherein the inorganic base is sodium carbonate or potassium carbonate.

10. The process of claim 6 wherein the inorganic base is employed in an amount sufficient to provide a molar ratio of base to halide-functional monomer of at least 2:1.

11. The process of claim 1 wherein the palladium complex is employed in an amount sufficient to provide a molar ratio or palladium to monomer in the range of from 0.001:1 to 0.05:1.

12. The process of claim 4 wherein the palladium complex is employed in an amount sufficient to provide a molar ratio or palladium to monomer in the range of from 0.001:1 to 0.05:1.

13. The process of claim 7 wherein the palladium complex is employed in an amount sufficient to provide a molar ratio or palladium to monomer in the range of from 0.001:1 to 0.05:1.

14. The process of claim 9 wherein the palladium complex is employed in an amount sufficient to provide a molar ratio or palladium to monomer in the range of from 0.001:1 to 0.05:1.

15. The process of claim 1 wherein the phase transfer catalyst is $C_4$–$C_{30}$ tetraalkylammonium halide.

16. The process of claim 4 wherein the phase transfer catalyst is $C_4$–$C_{30}$ tetraalkylammonium halide.

17. The process of claim 7 wherein the phase transfer catalyst is $C_4$–$C_{30}$ tetraalkylammonium halide.

18. The process of claim 9 wherein the phase transfer catalyst is $C_4$–$C_{30}$ tetraalkylammonium halide.

19. The process of claim 1 wherein the phase transfer catalyst is employed in an amount sufficient to provide a molar ratio of catalyst to monomer of at least 0.01:1.

20. The process of claim 1 wherein the polymer reaches a degree of polymerization of at least 20 in less than 24 hours.

21. The process of claim 20 wherein the molar ratio of monomers having two groups selected from boronic acid, $C_1$–$C_6$ boronic acid ester, $C_1$–$C_6$ borane, and combinations thereof to aromatic dihalide-functional monomers is no greater than 1.10:1.00.

22. The process of claim 1 wherein the polymer contains at least 20 groups of the formula:

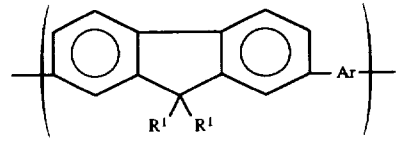

wherein Ar is a conjugated unsaturated group; and $R^1$ is independently in each occurrence $C_1$–$C_{20}$ hydrocarbyl or $C_1$–$C_{20}$ hydrocarbyl containing one or more S, N, O, P or Si atoms, $C_4$–$C_{16}$ hydrocarbyl carbonyloxy, $C_4$–$C_{16}$ aryl (trialkylsiloxy) or both. $R^1$ may form with the 9-carbon on the fluorene ring a $C_5$–$C_{20}$ ring structure or a $C_4$–$C_{20}$ ring structure containing one or more heteroatoms of S, N or O.

23. The process of claim 12 wherein Ar is benzothiadiazole.

* * * * *